(12) United States Patent
Morris, Sr. et al.

(10) Patent No.: US 6,270,463 B1
(45) Date of Patent: Aug. 7, 2001

(54) SYSTEM AND METHOD FOR MEASURING TEMPERATURE IN A STRONG ELECTROMAGNETIC FIELD

(75) Inventors: G. Ronald Morris, Sr., Bay Shore, NY (US); James W. Valentine, Spokane, WA (US)

(73) Assignee: Medrad, Inc., Indianola, PA (US)

( * ) Notice: Subject to any disclaimer, the term of this patent is extended or adjusted under 35 U.S.C. 154(b) by 0 days.

(21) Appl. No.: 09/448,865

(22) Filed: Nov. 23, 1999

(51) Int. Cl.$^7$ .................................................... A61B 5/00
(52) U.S. Cl. ........................................................ 600/549
(58) Field of Search ................................. 600/549, 412, 600/300, 410, 421

(56) References Cited

U.S. PATENT DOCUMENTS

| | | |
|---|---|---|
| 4,558,279 | 12/1985 | Ackerman et al. . |
| 4,914,608 | 4/1990 | LeBihan et al. . |
| 5,109,853 | 5/1992 | Taicher et al. . |
| 5,190,039 | 3/1993 | Takeuchi et al. . |
| 5,207,222 | 5/1993 | Koizumi et al. . |
| 5,209,233 | 5/1993 | Holland et al. . |
| 5,378,987 | 1/1995 | Ishihara et al. . |
| 5,464,014 | 11/1995 | Sugahara . |
| 5,492,122 | 2/1996 | Button et al. . |
| 5,653,239 | * 8/1997 | Pompei et al. ................. 600/549 |
| 5,711,300 | 1/1998 | Schneider et al. . |
| 5,730,134 | 3/1998 | Dumoulin et al. . |
| 5,906,584 | 5/1999 | Pavoni et al. . |
| 5,916,161 | 6/1999 | Ishihara et al. . |
| 6,001,066 | * 12/1999 | Canfield et al. ................. 600/549 |

FOREIGN PATENT DOCUMENTS

| | | |
|---|---|---|
| 0 558 029 A2 | 9/1993 | (EP) . |
| 404352971A | 12/1992 | (JP) . |
| 409019411A | 1/1997 | (JP) . |
| 409262222A | 10/1997 | (JP) . |

\* cited by examiner

Primary Examiner—John P. Lacyk
Assistant Examiner—Brina Szmal
(74) Attorney, Agent, or Firm—Amster, Rothstein & Ebenstein

(57) ABSTRACT

A system for monitoring the temperature of a patient undergoing an examination in strong magnetic field, such as that created by an MRI machine. The system includes a temperature sensor composed of a high accuracy temperature probe that is coupled to an electronics module by an RF current reduction network. The temperature sensor is excited by a constant current provided on two of the four leads comprising the RF current reduction network. The remaining two leads connect to an instrumentation amplifier. All of the circuitry is located within a Faraday housing, and all connections made between the sensor and the electronics module pass through RF filters mounted in the Faraday housing, allowing the electronics module to be positioned within the strong magnetic field. The temperature measurement signal provided by the instrumentation amplifier is pulse-width modulated and supplied to a fiber optic transmitter for transmission along a fiber optic cable to a temperature monitor located outside of the strong magnetic field. At the temperature monitor, a fiber optic receiver converts the received signal to an electrical signal for display of the measured temperature. In an alternative embodiment, a low battery signal is generated when the voltage of the battery powering the electronics module falls below a predetermined threshold. The low battery signal is combined with the temperature signal by a summing amplifier and the combined signal is transmitted to the temperature monitor. The temperature monitor then separates the two signals for display of the measured temperature and the battery status.

10 Claims, 2 Drawing Sheets

SYSTEM AND METHOD FOR MEASURING TEMPERATURE IN A STRONG ELECTROMAGNETIC FIELD

FIELD OF THE INVENTION

This invention relates to instruments for making a temperature measurement in a strong electromagnetic field environment such as is found in magnetic resonance imaging (MRI) machines.

BACKGROUND OF THE INVENTION

Strong pulsed radio frequency (RF) fields in the imaging cavity of an MRI machine may induce very high RF currents in the conventional long, low resistance, electrical cables typically used with standard diagnostic electronic instruments, such as temperature measuring devices. These cables and the associated sensors can become very hot due to RF $I^2R$ heating, and if in contact with a patient's skin, can cause severe burns. Apart from the possibility of burning the patient, RF heating of a temperature sensor would nullify its usefulness as a temperature measuring device. In addition, the RF pulses, which are picked up on the long, low resistance, electrical cables normally used when measuring temperature, often enter the data monitoring equipment where they can degrade measurement accuracy. Conversely, many data monitoring instruments generate high frequency noise signals. These signals are often radiated from the instrument cables in the form of electromagnetic waves and are picked up by the MRI machine, which can cause artifacts in the MRI image.

U.S. Pat. No. 5,730,134 to Dumoulin et al. ("the '134 Patent") discloses a temperature monitoring system which employs a temperature sensor that is incorporated into a device 150 that is inserted into a body during an MRI scan. The inserted device is used in conjunction with the MRI machine to position itself within the body or for localized magnetic resonance imaging within the body. As shown in FIG. 2, the inserted device 150 comprises a a small RF coil 200 which is electrically coupled to the MRI system via conductors 210 and 220. The temperature sensor used to monitor the temperature of inserted device 150 could undergo localized heating due to induced RF currents. If a temperature rise in excess of a predetermined threshold is detected, power to the MRI machine is either reduced or cut off. In the preferred embodiment shown in FIG. 2, the temperature sensor consists of a flouresescent substance 275 located at the remote end of fiber optic cable 270, which is connected to a light sensor 207 at the local end thereof. The '234 Patent indicates that in other embodiments the temperature sensor may comprise other temperature measurement devices such as a thermistor or thermocouple. However, the '134 Patent does not disclose any system or method which is used to prevent RF heating from occurring in the first instance. In addition, the temperature measurement system of the '134 Patent is used to monitor changes in the 10 temperature of the inserted device, not to monitor the patients temperature.

U.S. Pat. No. 5,209,233 to Holland et al. ("the '233 Patent") discloses a system which monitors the temperature of ECG electrodes 40 mounted on a patient 8 undergoing an MRI scan (FIG. 2) to ensure that ECG electrode 40 does not undergo "localized heating" during an MRI examination and to allow monitoring of the patient's skin temperature. Although the '233 Patent does disclose impedances 64 and 82 connected in series with the RTD or thermistor 60 located at the ECG electrode to prevent excessive currents from being induced in lead 62 by either radio frequency signals or changing magnetic field gradients, the '233 Patent does not disclose the particular structure used in the temperature measurement system of the present invention in which a thermistor probe connected in the resistive mode of operation is driven by a constant current source through a first pair of leads and an instrument amplifier is connected to the temperature sensor through a second pair of leads combine to generate a signal representative of the measured temperature. In addition, the '233 Patent does not disclose another aspect of the present invention, namely, a low battery sensing circuit which provides an indication of the status of a battery used to provide power to the temperature measurement system.

It is therefore an objective of the present invention to provide an improved system for measuring temperature of a patient within an MRI machine which eliminates thermal heating of the cables and associated sensors due to RF $I^2R$ heating. is yet another objective of the present invention to provide an improved system for measuring temperature of a patient within an MRI machine which prevents RF noise from entering the data monitoring equipment.

It is a further objective of the present invention to provide a system for measuring temperature of a patient within an MRI machine which prevents high frequency noise signals from the data monitoring equipment from causing artifacts in an MRI image.

It is a still further object of the present invention to provide a system for measuring temperature within an MRI machine which also includes a system for indicating a low battery condition in the monitoring equipment.

SUMMARY

It has now been found that these and other objects of the invention are realized by the temperature measurement system of the present invention. In the presently preferred embodiment, a temperature sensor having output terminals is attached to a patient. An electronics sensor module coupled to the termpreature sensor generates an output signal responsive to the temperature measured by the temperature sensor. The electronic sensor module comprises a constant current source and a differential amplifier each having terminals coupled to the output terminals of the temperature sensor, and a transmitter having an input coupled to the output of the differential amplifier. Inteposed between the temperature sensor and the electronics module is an RF current reduction network. A temperature monitor processes a signal received from the electronics module and provides an indication of the measured temperature.

Preferably, the temperature monitor displays the measured temperature and comprises a receiver having an input coupled to a communications medium (which is also coupled to an output of the electronics module transmitter) and an output coupled to a controller for processing information received from the electronics sensor module.

Preferably, the temperature sensor comprises a dual-thermistor temperature probe and a linearizing network connected in a resistance mode. Preferably, the RF current reduction network comprises first and second series-connected resistors coupled between each of the output terminals of the temperature sensor and each of the connections to the constant current source and the differential amplifier. Preferably, the first resistor has a value of approximately 10 kohms and the second resistor has a value of approximately 1 kohms. Still further, preferably, the electronics sensor module is mounted within a Faraday housing and RF filters are mounted in the Faraday housing and interposed between the output of the RF current reduction network and the connections to the differential amplifier and to the constant current source. Finally, preferably, the transmitter comprises a pulse-width modulator coupled to a fiber optic transmitter, the communications medium comprises a fiber optic cable and the receiver comprises a fiber optic receiver coupled to a pulse-width demodulator.

In another aspect of the invention, the electronics sensor module includes a low battery sensing circuit which generates a low battery signal when the voltage of the battery providing power to the module falls below a predetermined threshold. The low battery signal is provided to the temperature monitor for display. In this way, the status of the battery can be monitored and a low battery condition detected so that the battery can be promptly replaced before the electronics sensor module becomes inoperative.

BRIEF DESCRIPTION OF THE DRAWINGS

The above and related objects, features and advantages of the present invention will be more fully understood by reference to the following detailed description of the presently preferred, albeit illustrative, embodiments of the present invention when taken in conjunction with the accompanying drawing wherein.

DETAILED DESCRIPTION OF THE PREFERRED EMBODIMENTS

Figure 1:
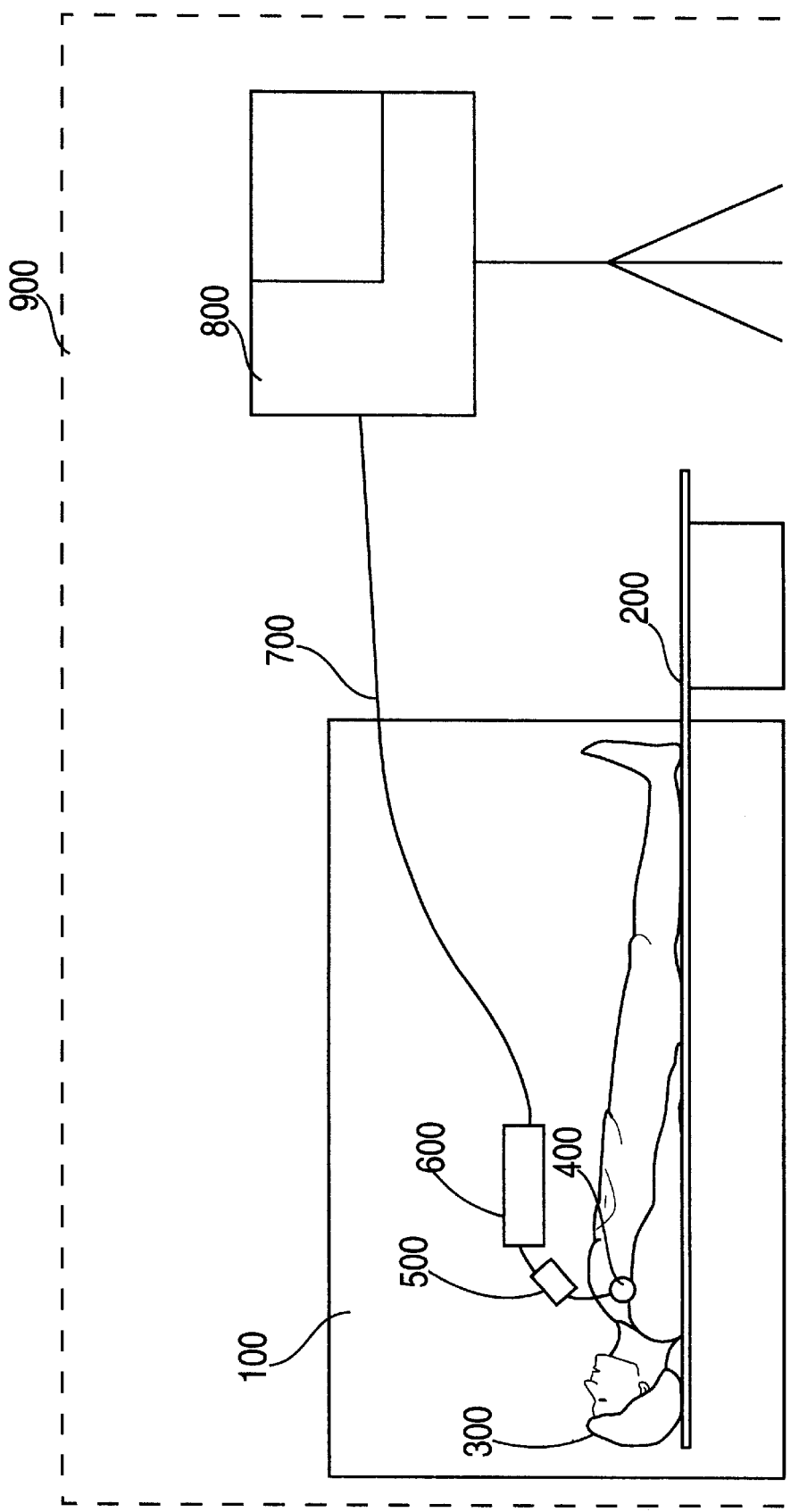
FIG. 1 is a representation of the temperature measurement system of the present invention used in conjunction with an MRI machine.

Referring now to FIG. 1, an MRI machine 100 with patient bed 200 is shown inside a shielded room 900. Preferably, a temperature sensor 400 is attached to a patient 300 lying on bed 200 and is connected by RF current reduction network 500 to a shielded electronics module 600 located within the magnetic field produced by MRI machine 100. Preferably, a fiber optic cable 700 connects electronics module 600 to ECG monitor 800 located outside the MRI machine 100 but elsewhere within shielded room 900. By using RF current reduction network 500, placing an intermediary shielded electronics module 600 close to patient 300, and using fiber optic cable 700, or other non-conductive media, instead of conductive wires to connect module 600 to monitor 800, the length of wires necessary within the MRI environment is minimized, and the amount of RF pickup and the heating of sensor 400 is greatly reduced.

Figure 2:
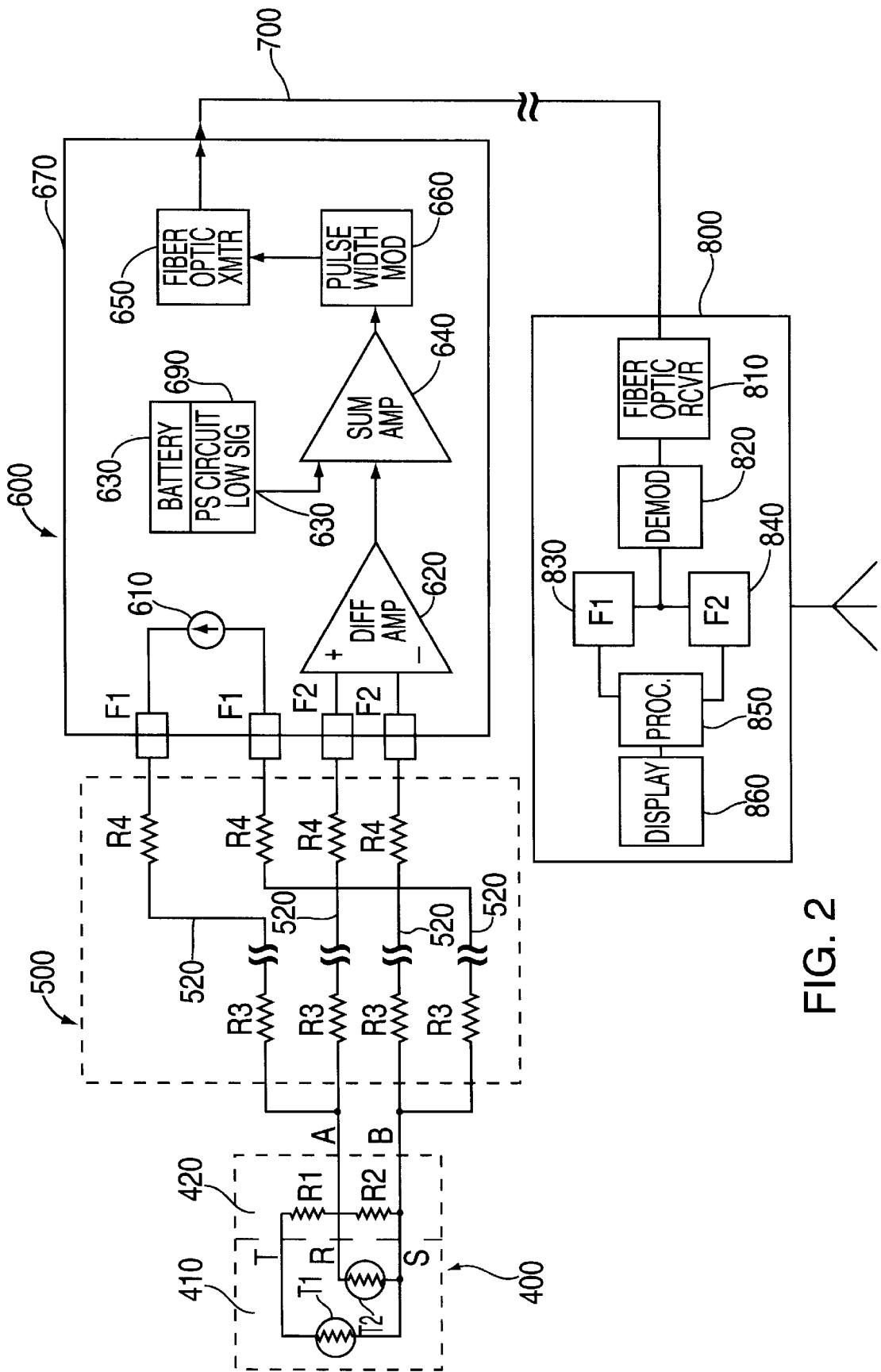
FIG. 2 is a schematic diagram of the temperature sensor, the noise reduction network, the electronics sensor module and the temperature module of the present invention.

Referring now to FIG. 2, temperature sensor 400 comprises of two components; a dual-element thermistor probe 410 and a linearizing network 420 including resistors R1 and R2. Thermistor probe 410 must be a high accuracy thermistor temperature probe, such as, for example, Model 709B manufactured by YSI Incorporated, Yellow Springs, Ohio. Of couse, as one skilled in the art will readily recognize, comparable thermistor probes having similar specifications may be alternatively used. Also, other resistive temperature sensors, such as an RTD, may also be employed. In addition, in the preferred embodiment, resistor R1 has a value of 6.25 kohms and resistor R2 has a value of 3.20 kohms. As one skilled in the art will understand, the actual values for resistors R1 and R2 will vary with the particular type of temperature probe selected and with other circuit design considerations, and in the case of an RTD, may not be necessary. As specifically shown in FIG. 2, probe 410 and linearizing network 420 are connected in the "resistance mode" of operation, with first thermistor T1 connected in parallel with the series combination of resistors R1 and R2, and second thermistor T2 connected in parallel with resistor R2. When connected in this manner, sensor 400 has a resistance between sensor terminals A and B that has a linear negative temperature coefficient. Other types of temperature probes may produce a positive temperature coefficient.

Sensor 400 is coupled to electronic circuit module 600 by via RF current reduction network 500. RF current reduction network 500 preferably comprises four leads 520, each including two series connected resistors, a first resistor R3 at the sensor 400 end and a second resistor R4 at the circuit module 600 end, coupled between the sensor output A, B and each of the connections, respectively, to constant current source 610 and differential amplifier 620. Preferably, resistor R3 has a value of 10 kohms and resistor R4 has a value of 1 kohms. Resistors R3 and R4 mitigate any high RF currents which otherwise would be induced in leads directly connecting the temperature sensor 400 to the electronics module 600, and related RF noise radiation caused thereby. The four leads 520 are bundled together to minimize RF pickup, e.g., by twisting the leads together. Preferably, leads 520 each have a length of 8 inches, although, as one skilled in the art will readily recognize, the length is a design consideration that may be increased or decreased accordingly, depending on the particular application. Notably, leads 520, due to their flexibility, allow for convenient positioning of sensor 400 while making it possible for the MRI operator to position circuit module 600 so as not to obscure any particular area of interest on patient 300 from MRI imaging.

Constant current source 610 may be either AC or DC, but in any event must maintain its stability over time and temperature to ensure an accurate temperature measurement. In the event that an AC current is produced by constant current source 610, care must be take in the selection of the frequency thereof to ensure that it can be distinguished from the low battery signal discussed below. In the preferred embodiment, constant current source 610 provides an output current of 120 microamps DC. Since, as one skilled in the art will recognize, differential amplifier 620 has a negligible input current with respect to the current supplied by current source 610, the voltage drop across terminals A and B of sensor 400 varies linearly with the temperature at sensor 400, since, as described above, the resistance between terminals A and B varies linearly with the temperature at sensor 400. Therefore, as one skilled in the art will recognize, resistance of RF current reduction network 500 and any variations thereof have no effect on the voltage induced across sensor 400 in the present invention, since a constant current is used to excite sensor 400. A contrary result would be the case if sensor 400 was connected in the voltage mode and driven by a constant voltage source.

Module 600 is enclosed within a Faraday shield 670. The connections between leads 520 and current source 610 are made through RF filters F1 installed within Faraday shield 670. Likewise, the connections between leads 520 and differential amplifier 620 are made through RF filters F2 which are also mounted within Faraday shield 670. RF filters F1 and F2 and Faraday shield 670 prevent RF pulses, generated by the MRI tunnel and picked up by leads 520, from entering sensor module 600. RF filters F1 and F2 also prevents inference to the MRI signal from pulses generated in sensor module 600. It is preferable for RF filters F1 and F2 to provide attenuation in excess of 50dB at a frequency of 8.5 MHz and 70dB at 85MHz. One example of an RF filter for use with this invention would have a cutoff frequency of 16 kHz and an attenuation of 20dB per decade of frequency.

Since differential amplifier 620 has a negligible input current with respect to the current supplied by current source 610, the induced sensor voltage across terminals A and B of sensor 400 also appears at the input of differential amplifier 620. Differential amplifier 620 is preferably an integrated instrumentation amplifier, such as the Model AD620 manufactured by Analog Devices, although as one skilled in the art will readily recognize, various other amplifier configurations may be used. The AD620 model amplifier is specified to have a differential input resistance of 10G ohms, which when compared to the resistance of leads 520 will cause a measurement error of only 0.00022%, based upon the preferred resistance of leads 520 which is 22 kohms (consisting of 2×R3+2×R4). This measurement error has been found to be well below other system errors. By combining a thermistor-based sensor 400 configured in the resistance mode with leads 520 including resistors R3 and R4, the present invention maintains measurement accuracy and effectively suppresses high RF currents in the leads, the sensor, and the circuit module, even when placed within an active MRI chamber.

Electronic module 600 is powered by a non-magnetic battery 630 which is connected to a power supply circuit 690 which, preferably includes, but does not require, a low battery indicating circuit having a low battery voltage monitor output 680. When the voltage of battery 630 drops below a predetermined threshold, a low battery signal comprising a 200 Hz AC signal is produced on battery voltage monitor output 680 by the low battery indicating circuit. The low battery indicating circuit is constructed in a conventional manner as would be understood by one skilled in the art. A summing amplifier 640 combines the 200 Hz AC low battery signal with the temperature signal at the output of differential amplifier 620. The combined signal at the output of summing amplifier 640 is encoded by pulse-width modulator 660 and provided to fiberoptic transmitter 650, which converts the modulated electrical signal to a modulated light signal for transmission on fiber-optic cable 700. In the first embodiment, the output of differential amplifier 620 is supplied directly to pulse-width monitor 660.

As shown in FIGS. 1 and 2, fiber-optic cable 700 exits the MRI machine and is connected to a fiber-optic receiver 810 within temperature monitor 800. Fiber-optic receiver 810 converts the modulated light signal back to an electrical signal, which is provided to demodulator circuit 820. The demodulated signal is applied to a first filter 830 which extracts the temperature measurement signal. As understood by one skilled in the art, the type of filter, and the specifications thereof, depend on the type of current produced by constant current source 610. For example, in the preferred embodiment, a DC current is output by constant current source 610 and therefore filter 830 is a low pass filter having a cutoff frequency based upon the desired response time of the system. In the preferred embodiment, the demodulated signal may also be applied to a second filter 840 which extracts the AC low battery signal. In the preferred embodiment, since the temperature measurement signal is a DC signal, filter 840 may be a high pass filter having a low cutoff frequency to block the resultant DC temperature measurement signal, and could be simply an appropriately selected capacitor, as one of skill in the art readily recognize. Filter 840 could also be a band-pass filter. The separated temperature measurement signal and AC low battery signal may then be supplied to controller 850 which then may process these signals and produce an output representative of these signals for display of the patient temperature and battery status on a monitor 860 for viewing by the user.

All components electronics sensor module 600 must be non-magnetic and any electrical conductive material in electronics sensor module 600, such as circuit board runs and Faraday shield 670 should be thin consistent with other performance requirements.

Although this invention uses fiber optic cables for communication between electronics sensor module 600 and temperature monitor 800, other methods of communication can be utilized, including, but not limited to, infrared, ultrasound, or RF signals. In addition, other methods of encoding (and therefore decoding) the combined temperature measurement and low battery signal may be employed for information transmission and reception, including but not limited to frequency modulation and pulse position modulation.

Now that the preferred embodiments of the present invention have been shown and described in detail, various modifications and improvements thereon will become readily apparent to those skilled in the art. Accordingly, the spirit and scope of the present invention is to be construed broadly and limited only by the appended claims, and not by the foregoing specification.

We claim:

1. A system for measuring temperature of a patient while the patient is within the influence of a strong magnetic field, comprising:
   a) a temperature sensor which is arranged to produce an output signal representative of temperature arranged to be attached to a patient;
   b) an electronics sensor module mounted within a Faraday shield coupled to receive the output signal produced by said sensor and to generate an output signal representative of the temperature of said sensor, said module comprising a constant current source and a differential amplifier coupled to said sensor, and a transmitter coupled to receive an output of said differential amplifier;
   c) an RF current reduction network coupled between the output of said sensor and said constant current source and said differential amplifier; and
   e) a temperature monitor having an input coupled to receive an output signal produced by said module which processes the output signal to provide an indication of the temperature of said sensor.

2. The temperature measurement system of claim 1, wherein said temperature sensor comprises a dual-thermistor temperature probe and a linearizing network connected in a resistance mode.

3. The temperature measurement system of claim 1, wherein said RF current reduction network includes first and second series-connected circuit elements coupled between each output terminal of said sensor and each terminal of said constant current source and said differential amplifier.

4. The temperature measurement system of claim 3, wherein each circuit element is a resistor, the value of which is selected to reduce RF current in the system.

5. The temperature measurement system of claim 1, further comprising RF filters mounted in said Faraday housing which interconnect said first circuit elements and said constant current source, and said second circuit elements and said amplifier.

6. The temperature measurement system of claim 1, further comprising a fiber optic cable connected between an output of said transmitter and said input of said temperature monitor.

7. A system for measuring temperature of a patient while the patient is within the influence of a strong magnetic field, comprising:

a) a temperature sensor arranged to be attached to a patient;

b) an electronics sensor module coupled to said sensor comprising a battery for providing power to said module and a low battery sensing circuit which provides a low battery output signal when the battery voltage is less than a predetermined threshold; and c) a monitor having an input coupled to receive said low battery output signal produced by module which processes the low battery output signal to provide an indication when the battery voltage falls below the predetermined threshold.

8. The temperature measurement system of claim 7, wherein said electronics sensor module further comprises a constant current source and a differential amplifier coupled to said sensor to generate an output signal representative of the temperature of said sensor, a summing amplifier coupled to receive an output of said differential amplifier and said low battery output signal and a transmitter coupled to receive an output of said summing amplifier.

9. The temperature measurement system of claim 8, wherein said temperature sensor comprises a dual-thermistor temperature probe and a linearizing network connected in a resistance mode.

10. The temperature measurement system of claim 8, further comprising a fiber optic cable connected between an output of said transmitter and said input of said temperature monitor.

* * * * *